United States Patent
Gospodinova-Daltcheva et al.

(10) Patent No.: US 7,345,363 B2
(45) Date of Patent: Mar. 18, 2008

(54) SEMICONDUCTOR DEVICE WITH A REWIRING LEVEL AND METHOD FOR PRODUCING THE SAME

(75) Inventors: Minka Gospodinova-Daltcheva, München (DE); Harry Huebert, Aschheim (DE); Rajesh Subraya, München (DE); Jochen Thomas, München (DE); Ingo Wennemuth, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/362,507

(22) Filed: Feb. 27, 2006

(65) Prior Publication Data

US 2006/0244120 A1 Nov. 2, 2006

Related U.S. Application Data

(63) Continuation of application No. PCT/DE2004/001853, filed on Aug. 19, 2004.

(30) Foreign Application Priority Data

Aug. 27, 2003 (DE) ............................... 103 39 762

(51) Int. Cl.
*H01L 23/48* (2006.01)
(52) U.S. Cl. .................. 257/692; 257/691; 257/725
(58) Field of Classification Search .......... 257/678, 257/686, 687, 691, 692, 698, 700–702, 707, 257/723, 729, 735, 736, 773–781, 784, 786–789, 257/E23.01, E23.012, E23.022, E23.31, E23.32, 257/E23.35, E23.36, E23.69, E23.79, E23.141, 257/E23.142, E23.144, E23.151, E23.169, 257/E23.173, E23.92; 438/106–112, 118; 365/52–54

See application file for complete search history.

(56) References Cited

U.S. PATENT DOCUMENTS

| | | | |
|---|---|---|---|
| 4,866,507 A | | 9/1989 | Jacobs et al. |
| 5,231,305 A | * | 7/1993 | Russell ...................... 257/701 |
| 5,304,843 A | | 4/1994 | Takubo et al. |
| 6,023,209 A | * | 2/2000 | Faulkner et al. ............ 333/238 |
| 6,211,576 B1 | * | 4/2001 | Shimizu et al. ............. 257/786 |
| 6,215,175 B1 | | 4/2001 | Kinsman |
| 6,218,731 B1 | | 4/2001 | Huang et al. |
| 6,278,616 B1 | * | 8/2001 | Gelsomini et al. .......... 361/803 |
| 6,300,165 B2 | * | 10/2001 | Castro ........................ 438/118 |
| 6,373,131 B1 | * | 4/2002 | Karnezos ..................... 257/712 |

(Continued)

FOREIGN PATENT DOCUMENTS

DE 41 15 421 A1 11/1991

(Continued)

*Primary Examiner*—Zandra V. Smith
*Assistant Examiner*—Paul E Patton
(74) *Attorney, Agent, or Firm*—Edell, Shapiro & Finnan, LLC (57) ABSTRACT

A semiconductor device includes a plastic package, at least one semiconductor chip and a rewiring level. The rewiring level includes an insulating layer and a rewiring layer. The rewiring layer includes either signal conductor paths and ground or supply conductor paths arranged parallel to one another and alternately, or only signal conductor paths arranged parallel to one another. In the latter case, an electrically conducting layer of metal which can be connected to ground or supply potential is additionally provided as a termination of the rewiring level or in the form of a covering layer.

12 Claims, 4 Drawing Sheets

U.S. PATENT DOCUMENTS

| | | |
|---|---|---|
| 6,376,904 B1 | 4/2002 | Haba et al. |
| 6,545,366 B2 * | 4/2003 | Michii et al. ............... 257/777 |
| 6,549,413 B2 | 4/2003 | Karnezos et al. |
| 6,608,389 B1 | 8/2003 | Hashimoto |
| 2001/0009782 A1 | 7/2001 | Ball et al. |
| 2001/0033015 A1 * | 10/2001 | Corisis ....................... 257/691 |
| 2001/0038141 A1 | 11/2001 | Wensel |
| 2002/0042160 A1 | 4/2002 | Brooks et al. |
| 2002/0093804 A1 | 7/2002 | Schoenborn |
| 2002/0100960 A1 | 8/2002 | Chang et al. |
| 2002/0175422 A1 | 11/2002 | Akram et al. |
| 2003/0030151 A1 | 2/2003 | Morozumi |

FOREIGN PATENT DOCUMENTS

| | | |
|---|---|---|
| DE | 101 33 571 A1 | 1/2003 |

* cited by examiner

FIG 4 and the arrangement of contact areas of the semiconductor chips in the bonding channels with rows of contact areas or rows of bonding pads.

In accordance with the invention, a semiconductor device comprises a plastic package, a first semiconductor chip and a rewiring level. The semiconductor chip of the semiconductor device includes an active upper side with signal contact areas. The signal contact areas are arranged in rows in a central bonding channel. The rewiring level of the semiconductor device is arranged on the active upper side of the semiconductor chip and includes as a first layer a closed metal layer. This metal layer may be connected to a ground or supply potential and consequently reduces the inductance of the integrated circuit of the semiconductor chips.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

SEMICONDUCTOR DEVICE WITH A REWIRING LEVEL AND METHOD FOR PRODUCING THE SAME

CROSS REFERENCE TO RELATED APPLICATIONS

This application is a continuation of PCT/DE2004/001853, filed Aug. 19, 2004, and titled "Semiconductor Device With a Rewiring Level and Method for Producing the Same," which claims priority to German Application No. DE 103 39 762.0, filed on Aug. 27, 2003, and titled "Semiconductor Device With a Rewiring Level and Method for Producing the Same," the entire contents of which are hereby incorporated by reference.

FIELD OF THE INVENTION

The present invention relates to a semiconductor device with a plastic package, with at least one semiconductor chip and with a rewiring level, and also to a method for producing the same.

BACKGROUND

Graphic memory devices are ahead of standard memory devices in terms of their electrical requirements. With desired clock frequencies in the gigahertz range, high speeds are expected in the semiconductor chips, unattainable with conventional bonding pad arrangements in the form of rows of signal contact areas in a central bonding channel, especially since the long rewiring lines from the central bonding channel to the peripheral sides of the memory chips have excessively high inductance values, which increase the impedance and reduce the clock frequencies. These disadvantages have even more horrendous effects when it is attempted to stack such semiconductor chips of an identical type.

For rapid access to memory data of the semiconductor chips with clock frequencies in the gigahertz range, as in the case of DDR-II (Double Data Rate II) or DDR-III (Double Data Rate III) memory chips, chip stacks are not suitable. The stacking has the effect that such semiconductor devices with a semiconductor chip stack do not achieve the "high performance" criteria for DDR-II or DDR-III memory devices and therefore have until now only allowed themselves to be stacked by sacrificing "high performance", which leads to unacceptable values with respect to the criteria of DDR-II devices.

SUMMARY OF THE INVENTION

The present invention reduces the inductive component of the impedance of a semiconductor device by providing structural design measures for a semiconductor device with a rewiring level that is suitable for clock frequencies in the gigahertz range and satisfies the DDR-III requirements. Furthermore, the present invention provides a chip stack and a semiconductor device with a chip stack which satisfy the "high performance" criteria, as required for DDR-II memory chips, in spite of semiconductor chips being stacked. The chip stack of the present invention preferably includes identical memory semiconductor chips, which include a central bonding channel with rows of signal contact areas or rows of bonding pads. Identical semiconductor chips are understood in this context as meaning the most similar possible size, the most similar possible topographical design

DETAILED DESCRIPTION

The present invention comprises a semiconductor device that includes a plastic package, a first semiconductor chip and a rewiring level. The semiconductor chip of the semiconductor device includes an active upper side with signal contact areas. The signal contact areas are arranged in rows in a central bonding channel. The rewiring level of the semiconductor device is arranged on the active upper side of the semiconductor chip and includes as a first layer a closed metal layer. This metal layer may be connected to a ground or supply potential and consequently reduces the inductance of the integrated circuit of the semiconductor chips.

Such a semiconductor device has an improved cutoff frequency and can be operated with clock frequencies in the gigahertz range, since the inductive component of the impedance is considerably reduced. The semiconductor device can consequently satisfy the requirements for DDR-III memory devices. In the region of the bonding channel, the metal layer includes a bonding channel opening, in order to permit access to the signal contact areas during bonding. The semiconductor chip is fixed on the metal layer of the rewiring level by an adhesive film in such a way that the signal contact areas of the semiconductor chip are arranged in the bonding channel opening. The rewiring level includes as a second layer an insulating layer with contact vias from the metal layer to external contact areas for ground or supply connections of a third layer. This third layer is arranged on the insulating layer as a rewiring layer. This rewiring layer additionally includes rewiring lines, which extend from the bonding channel to external contact areas for signal connections.

In a preferred embodiment of the invention, the signal contact areas are electrically connected to the rewiring lines by bonding wires in the bonding channel. The bonding wires in the bonding channel are led through the bonding channel opening in the metal layer, which lies at a ground or supply potential and consequently shields the signal-carrying bonding wires from stray fields.

Furthermore, the plastic package includes a plastic package molding compound, which covers the semiconductor chip on its back side and on its peripheral sides and the metal layer of the rewiring level, insofar as it is not covered by the adhesive film. Consequently, the active components of the semiconductor device of brittle semiconductor material are protected from mechanical damage. The bonding channel opening in the rewiring level is also filled with plastic package molding compound to the extent that all the bonding connections of the central bonding channel are embedded in plastic package molding compound and protected from mechanical damage.

A method for producing a semiconductor device of the invention, with a metal layer and a rewiring layer of a rewiring level, includes the following steps. First, a metal foil with device positions is provided, bonding channel openings being provided in the device positions. Subsequently, an insulating layer is applied to the metal foil and contact vias are then introduced into it. After that, a patterned rewiring layer is applied to the insulating layer. The rewiring layer includes rewiring lines and external contact areas, the rewiring lines extending from the region of the provided bonding channel openings to the external contact areas.

The provided central bonding channel opening is then introduced in the rewiring level at the device positions. After that, an adhesive film with bonding channel openings is applied to the metal foil and semiconductor chips are fixed on the latter, with the central bonding channels of the semiconductor chips being aligned with the bonding channel openings in the rewiring level. After that, bonding connections are established between the signal contact areas and the rewiring lines.

Next, the rewiring level is coated with a plastic package molding compound, embedding the semiconductor chips in the plastic package molding compound and thereby creating a composite sheet. The bonding channels are finally covered with plastic molding compound and the composite sheet is divided up into individual semiconductor devices.

This method has the advantage that the metal foil, which in methods for producing conventional devices is etched away, is retained as a component part or layer of the rewiring level and additionally brings about an effect of improving the high-frequency properties for the semiconductor device. The introduction of a bonding channel into the rewiring level with a metal layer can be facilitated, even before the insulating layer is applied to the metal foil, when the bonding channel openings are stamped into the metal layer at the device positions.

According to a second embodiment of the invention, a chip stack of semiconductor chips is provided comprising a first semiconductor chip and at least one stacked second semiconductor chip. The semiconductor chips include active upper sides with signal contact areas and ground or supply contact areas. In addition, at least one of the two semiconductor chips bears a special rewiring level, which includes an insulating layer, a rewiring layer and a covering level. The insulating layer is applied to the active upper side, while leaving the signal contact areas and the ground or supply contact areas of the semiconductor chip free.

The rewiring layer on at least the second semiconductor chip is patterned in such a way that it contacts the signal contact areas and the ground or supply contact areas by corresponding rewiring lines. In addition, the rewiring layer includes in a peripheral region of the rewiring level signal connection contact areas and ground or supply connection contact areas, which are connected by the rewiring lines to the signal contact areas and the ground or supply contact areas of the semiconductor chip. The rewiring layer with its electrically conducting patterns is protected by a covering level comprising an insulating material.

According to the second embodiment of the invention, the rewiring lines are arranged parallel to one another, signal conductor paths and ground or supply conductor paths being arranged alternately on the insulating layer of the rewiring level. These signal conductor paths and ground or supply conductor paths, running in parallel, connect the signal contact areas to the signal connection contact areas in the peripheral region of the rewiring layer and, correspondingly, the ground or supply conductor paths connect the ground or supply contact areas of the semiconductor chip to ground or supply connection contact areas arranged at the periphery of the rewiring level. Arranging signal connection contact areas and ground or supply connection contact areas in the peripheral regions of the rewiring layer has the advantage that the connection contact areas are more easily accessible for further rewiring.

Such a chip stack with such a rewiring pattern additionally has the advantage that alongside each signal conductor path there is a ground or supply conductor path arranged in the rewiring layer. This alternation of ground or supply conductor paths and signal conductor paths reduces the inductance component of the complex impedance of the conductor paths and contributes to allowing the connection resistance or the resistance of the leads to be virtually halved in comparison with conventionally stacked semiconductor chips, and consequently the criteria of the DDR-II memory chips to be satisfied.

Furthermore, the capacitive coupling of the conductor paths is extremely low, since only the cross-sectional thickness of the signal conductor paths and ground or supply conductor paths determines the size of the capacitive coupling. The ground or supply conductor paths arranged between respective pairs of signal conductor paths also provides the advantage that crosstalk between signal conductor paths is reduced.

The parallel routing and approximately equal length of the signal conductor paths in the rewiring layer also achieves the effect that transit time differences from signal conductor path to signal conductor path are reduced. Consequently, the performance is likewise improved. The invention is particularly suitable for identical chips, because low-cost production is then possible. Furthermore, the performance is improved, and memory chips are created with a high storage capacity as a result of the stacking and with great transit time constancy along with minimal transit time differences, and for high clock frequencies in the gigahertz range, as a result of the configuration of the rewiring layer.

Ground or supply conductor paths and ground or supply contact areas and ground or supply connection contact areas refer in this context to structures of the stacked semiconductor chips and of the corresponding rewiring levels which are connected by at least one corresponding external contact of the semiconductor device with stacked semiconductor chips to the ground or supply potential or ground potential of the circuit. On the other hand, signal conductor paths, signal contact areas and signal connection contact areas are designed for being able to transmit data in rapid succession and binary form, positive or negative pulses being transmitted, preferably pulse code modulation, over such areas or conductor path structures.

In the case of alternating signal conductor paths and ground or supply conductor paths, it is of advantage that the ground or supply conductor paths have a smaller width than the signal conductor paths. The greater width of the signal conductor paths contributes to the lower inductance and to a low resistance. For the ground or supply conductor paths, a small cross-section is sufficient for the current feedback according to the coplanar strips.

The chip stacks can include double-adhesive films between the stacked semiconductor chips, in order to hold the chip stack together and stabilize it. In this case, these intermediate films leave the connection contact areas in the peripheral regions of the respective rewiring layer free.

A third embodiment of the invention provides that the rewiring level on the stacked semiconductor chips is patterned in such a way that initially an insulating layer is again arranged on the active upper sides of the semiconductor chips. The rewiring layer has signal conductor paths that mainly run parallel and are arranged next to one another, between which no ground or supply conductor paths are arranged. Furthermore, the covering level is multilayered and patterned in such a way that initially a covering insulating layer is arranged on the rewiring layer and the entire semiconductor chip is covered or protected by an electrically conducting layer on the covering insulating layer. This electrically conducting layer lies at ground or supply potential.

In such an arrangement, the signal lines are separated from the ground or supply potential only by the thickness of the covering insulating layer. Consequently, the area of the induction loop for each of the signal lines is extremely small, whereby the inductive component of the impedance is significantly reduced and the overall complex impedance can be more than halved, even though the capacitive component is increased in comparison with the first aspect of the invention. A comparable transit time of the high-frequency signals is achieved for each of the connected signal contact areas on the semiconductor chip by the uniform parallel routing of the signal lines from the signal contact areas on the semiconductor chip to signal connection contact areas in the peripheral region of the rewiring layer.

The stacked semiconductor chips are arranged on a multilayered substrate for each of the second and third embodiments of the invention. In particular, the substrate includes a peripheral region with substrate connection areas which are not covered by a chip stack. This allows these substrate connection areas to be accessed. It is consequently possible to connect the signal connection contact areas of the chip stack to corresponding substrate connection areas, and similarly to connect the ground or supply connection contact areas of the chip stack to corresponding other substrate connection areas. It is also possible, on the substrate, for all the substrate connection areas which interact with the ground or supply connection contact areas to be short-circuited and led to a single external contact of the substrate by rewiring lines. For this purpose, the substrate includes a substrate rewiring layer.

Rewiring lines of the rewiring layer also connect the substrate connection areas by contact vias through the substrate to external contact areas of the semiconductor device. While the rewiring levels, which are arranged on the semiconductor chips, manage without contact vias, contact vias are provided for the multilayered substrate in order to get from the substrate contact areas arranged in the peripheral region to the external contact areas distributed in an annular or uniform manner on the underside of the substrate. Solder bumps or solder balls may be applied to the external contact areas as external contacts. On the other hand, it is possible to provide external contact areas, so that SMD arrangements (Surface Mounted Device arrangements) are possible on corresponding higher-level circuit substrates.

For the different embodiments of the present invention, there are different method sequences. With respect to the second embodiment of the invention, a method for producing a semiconductor device includes the following method steps. First, a number of semiconductor chips to be stacked are provided, each of the semiconductor chips including an active upper side and with signal contact areas and ground or supply contact areas. Subsequently, an insulating layer is applied as part of a rewiring level to the active upper sides of the semiconductor chips. In this case, the signal contact areas and the ground or supply contact areas are left free of insulating material such that, when applying the rewiring layer, the signal contact areas and the ground or supply contact areas can contact the conductor paths of a patterned rewiring layer.

The rewiring layer, comprising a conducting material, on the insulating layer of the rewiring level includes parallel-running signal conductor paths, between which ground or supply conductor paths are provided. The ground or supply conductor paths have a smaller width than the signal conductor paths. These parallel-running conductor paths extend from the contact areas of the semiconductor chip to the connection contact areas in the peripheral regions of the rewiring layer. This produces for each signal line a ground or supply potential surrounding the signal line, which brings about a reduction in the inductive component of the impedance of the leads on account of the small distance between the signal conductor paths and the ground or supply conductor paths.

Next, a covering level comprising insulating material is applied to a rewiring layer patterned in such a way so as to mitigate the first adhesion problems between the plastic package molding compound to be applied and the conductor paths, in particular in the region of the connection contact areas. When bonding connections are established, the adhesion of the connection contact areas of the rewiring layer is also subjected to considerable loading, so that instances of detachment or delamination can occur between the insulating layer of the rewiring level and the connection contact areas of the rewiring layer. If, however, a covering level is provided, leaving only partial regions of the connection contact areas of the rewiring layer that are necessary for bonding free, this second adhesion problem is mitigated.

A method for producing a semiconductor device of the third embodiment of the invention does not differ at first in the initial steps, that is the provision of a number of semiconductor chips to be stacked, the application of an insulating layer as part of a rewiring level and the application of a rewiring layer. However, when the rewiring layer is patterned, the conductor paths are then configured in such a way that they are approximately equally wide and parallel, since signal conductor paths are predominantly to be provided.

Only single ground or supply conductor paths of the semiconductor chip lie between or at the periphery of the signal conductor paths. And yet, a regular alternation of ground or supply conductor paths and signal conductor paths in the rewiring layer is not provided in the second embodiment of the invention. There is a further difference in the method in particular in the application of the covering level. This is now multilayered and now comprises at least an application of a covering insulating layer and an application of an electrically conducting layer. The covering insulating layer in turn improves the adhesion behavior between connection contact areas of the rewiring layer and the insulating layer lying under it and prevents a short-circuit of the signal lines, through the electrical conducting layer arranged on the covering insulating layer.

The electrically conducting layer can be connected to ground and ensures that the induction cross-section of the signal conductor paths and of the electrically conducting layer that can be connected to ground potential or ground potential is minimized. Consequently, the inductive component of the impedance of the leads is reduced, so that a matching to the "high performance" criteria for DDR-II memory devices is ensured.

In the second embodiment of the invention that includes a semiconductor device with stacked semiconductor chips, where only the stacked second semiconductor chip is to be provided with a covering level, additional bonding steps are required for a method for producing such a semiconductor device in order to connect the uppermost electrically conducting layer to the ground or supply potential of an external contact by at least two bonding stages. Further bonding connections are established, on the one hand, between the signal connection contact areas or at least one ground or supply connection contact area of the respective rewiring layer of the chip stack and corresponding substrate connection areas.

After the required bonding connections are established, the entire stack on the substrate can be embedded in a plastic molding compound, the underside of the substrate remaining free of plastic molding compound. On the underside of the substrate, the individual external contact areas can be delimited by a solder resist layer, so that it is possible to apply solder balls or solder bumps to the external contact areas of the semiconductor device on the underside of the multilayered substrate.

The substrate can comprise a panel, the substrate for a panel including device positions arranged in rows and columns and a stack of semiconductor chips according to the invention being arranged in each of the device positions, bonded and encapsulated with a plastic molding compound.

Thus, in accordance with the present invention, a suitable impedance check and matching is possible for stacked semiconductor chips with the aid of the specially formed rewiring layers on each of the semiconductor chips, and in particular on the uppermost semiconductor chip. It is therefore possible with the aid of the present invention for the impedance value of the leads on the rewiring level to be more than halved.

In addition, adhesion problems between a gold plating of the rewiring layer and the insulating layers can be solved by applying additional covering layers to the rewiring layer. The covering insulating layer is particularly helpful, representing a separating layer between the plastic molding compound of the package and the gold coating of the uppermost rewiring layer. Forces which occur during the molding process, that is to say when the plastic package molding compound is applied, consequently do not directly exert a load on the adhesion of the rewiring metal layer on the insulating layer located under it. Rather, the covering insulating layer has the effect of decoupling the effects of the plastic package molding compound on the sensitive structure of the rewiring layers.

To sum up, the following advantages are consequently obtained in accordance with the invention:

1. The electrical performance of a semiconductor device with rewiring levels corresponding to the third aspect of the invention is improved.
2. It is possible for the characteristic impedance for the signal conductor paths to be controlled, with simultaneous reduction of the impedance.
3. The problem of delamination of the boundary layers between the gold metal plating and the plastic package molding compound and between the gold plating and the insulating layer of the rewiring level is solved.
4. It is no longer necessary to provide comb-filter-like structures already on the semiconductor wafer in order to reduce the conductor path impedance.
5. Planarizing problems are avoided.

The formation of an additional ground area within a three-layered covering level between the first covering insulating layer and an additional second covering insulating layer achieves the effect of a sandwich-like construction of insulation, metal and renewed insulation, which permits simple grounding of the area by bonding wires at the outer peripheries of the covering level. A suitable choice between the conductor path width and the connection pitch for the contact connection areas can bring about a further reduction in the impedance of the leads.

The present invention is further described below in relation to the embodiments depicted in FIGS. 1-4.

Figure 1:
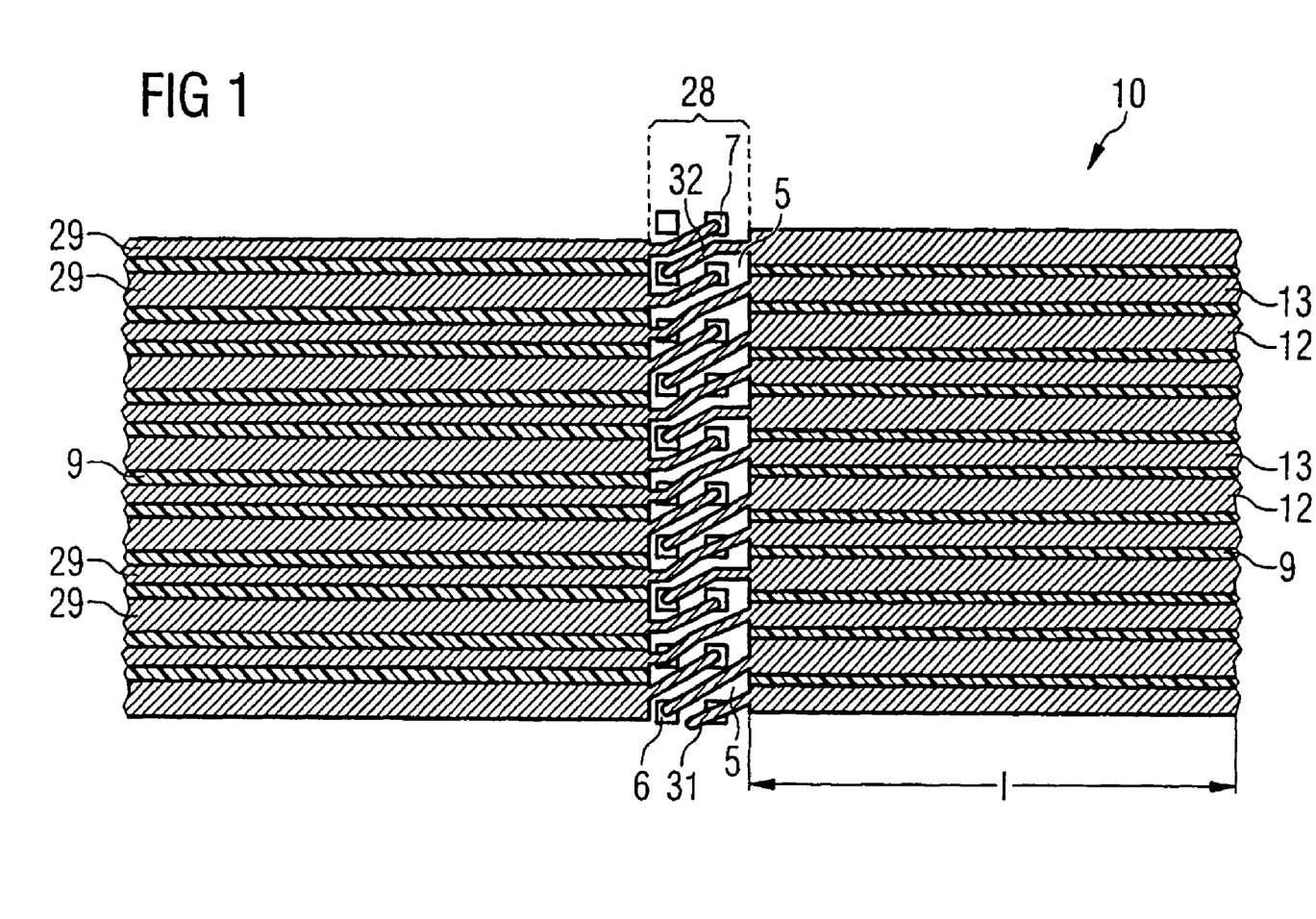
FIG. 1 schematically depicts a plan view of a rewiring layer of a rewiring level in accordance with the present invention.

FIG. 1 shows a schematic plan view of a rewiring layer 10 of a rewiring level. Seen in cross-section, the rewiring level of FIG. 1 includes three layers, that is an insulating layer 9, on which the patterned rewiring layer 10 shown here is arranged, while the covering level arranged on the rewiring layer 10 has been omitted to allow the arrangement of the conductor paths 29 to be explained on the basis of FIG. 1.

The parallel-running conductor paths 29 connect connection contact areas (not shown here) in the peripheral regions of the rewiring layer 10 to contact areas 6 and 7 in a central region 28 with rows of contact areas or rows of bonding pads on the active upper side 5 of a semiconductor chip. For this purpose, signal contact areas 6 and ground or supply contact areas 7 are provided in the central region 28. These areas are electrically connected by leads 31 and 32 to signal conductor paths 12 and ground or supply conductor paths 13. In this case, a ground or supply conductor path 13, which is connected to a ground or supply potential, lies between pairs of signal conductor paths 12. Furthermore, the lead length 1 of the parallel routing of the signal conductor paths 12 with respect to one another and of the ground or supply conductor paths 13 is virtually identical, so that transit time differences are minimized.

Furthermore, the alternation of signal conductor paths 12 and ground or supply conductor paths 13 has the effect of reducing the induction cross-section between the leads to a small distance between the signal lines and the ground or supply lines. The inductive component of the impedance of the leads is reduced.

The width of the signal conductor paths 12 in the embodiment of FIG. 1 lies from 20 μm to 170 μm and the width of the ground or supply conductor paths 13 lies from 20 μm to 150 μm. In this case, the width of the conductor paths must not vary significantly along the parallel routing, in order not to bring about any transit time differences between the individual signal conductor paths 12. The distance between the conductor paths is about 25 µm to 50 µm, so that a pitch between a signal conductor path 12 and the next signal conductor path 12 of at least 15 µm and at most 300 µm is obtained. The impedance could be reduced in comparison with conventionally patterned rewiring layers 10, which are at 160 ohms to 200 ohms for the impedance value, to 60 ohms to 75 ohms. This means a reduction in the impedance value to less than half with the aid of this special rewiring pattern of the rewiring layer 10.

Figure 2:
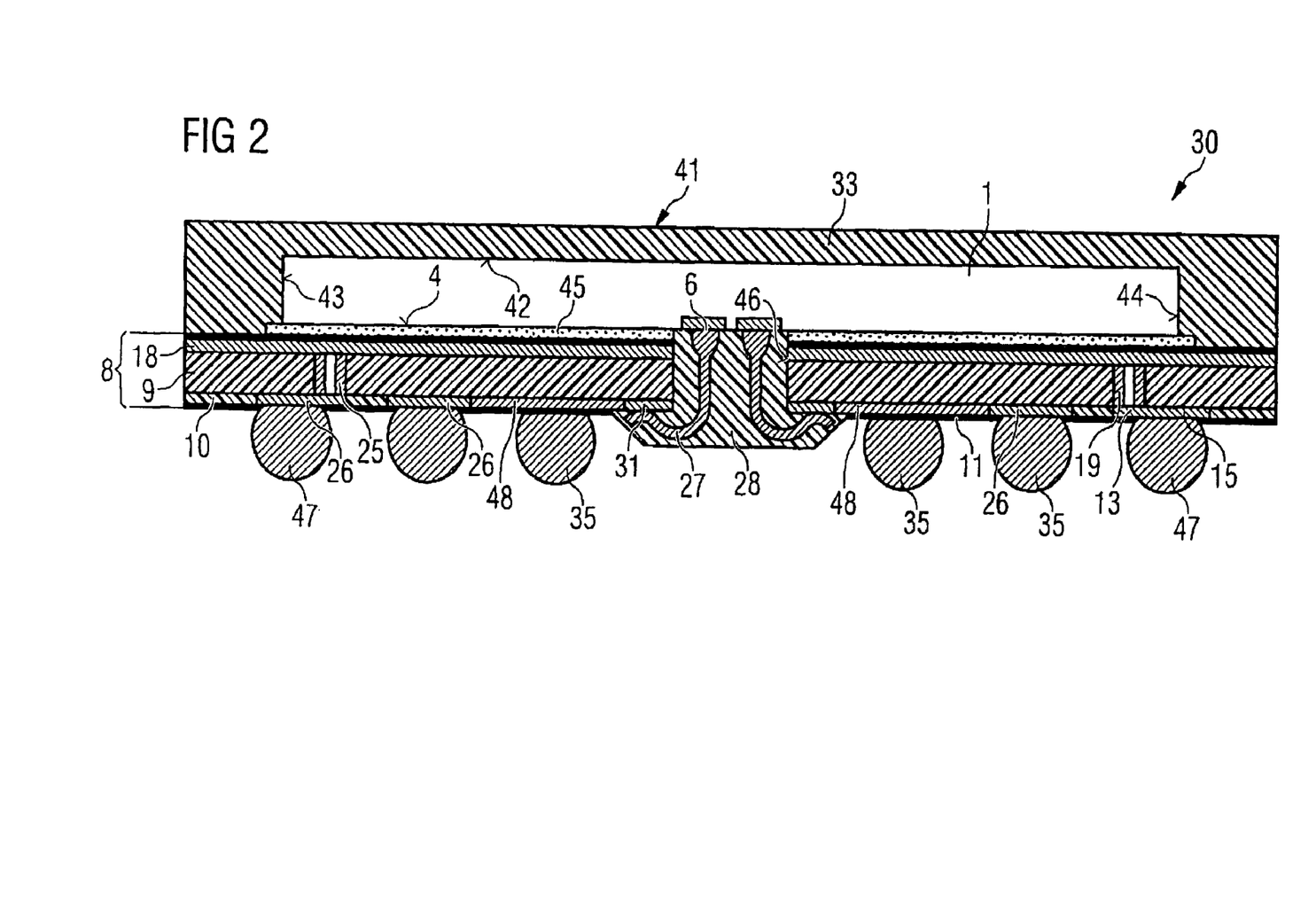
FIG. 2 schematically depicts a cross-section through a semiconductor device of a first embodiment of the present invention.

FIG. 2 shows a schematic cross-section through a semiconductor device 30 according to a first embodiment of the invention. This semiconductor device 30 includes a plastic package 41, in the plastic package molding compound 33 of which a semiconductor chip 1 is embedded with its back side 42 and its peripheral sides 43 and 44. The semiconductor chip 1 includes on its active upper side 4 a central bonding channel 28, in which rows of signal contacts with signal contact areas 6 are arranged. The active upper side 4 is fixed on a rewiring level 8 by a double-sided adhesive 45.

The rewiring level 8 includes a bonding channel opening 46 and is composed of four layers. The first layer is an electrically conducting layer 18 of metal, which covers the entire rewiring level 8 and is connected by contact vias 25 to a ground or supply potential, which can be connected to the external contacts 47.

As the second layer, the rewiring level 8 includes an insulating layer 9, which likewise has the bonding channel opening 28 and has the contact vias 25 to the external contacts 47 at ground or supply potential. Arranged as the third layer on the insulating layer 9 is a rewiring layer 10, which includes rewiring lines 48, which extend from the bonding channel 28 to external contact areas 26, on which the external contacts 35 for signal connections are arranged.

The rewiring layer 10 is protected by a fourth layer of the rewiring level 8. This fourth layer is a solder resist layer or covering layer 11, which leaves only the external contact areas 26 of the rewiring layer 10 free, in order that external contacts 35 and 47 can be applied there. Such a covering layer is also provided on the electrically conducting layer 18.

The signal contact areas 6 in the bonding channel 28 are connected by bonding wires 27 to the rewiring lines 48 of the rewiring layer 10.

If the metal layer 18 is connected to ground potential by the external contacts 47 and the contact vias 25, the impedance or the inductive component of the impedance is reduced on account of the small distance between metal layer 18, and the "high-frequency" performance of the semiconductor device is improved, in particular the high-frequency capability is improved.

Figure 3:
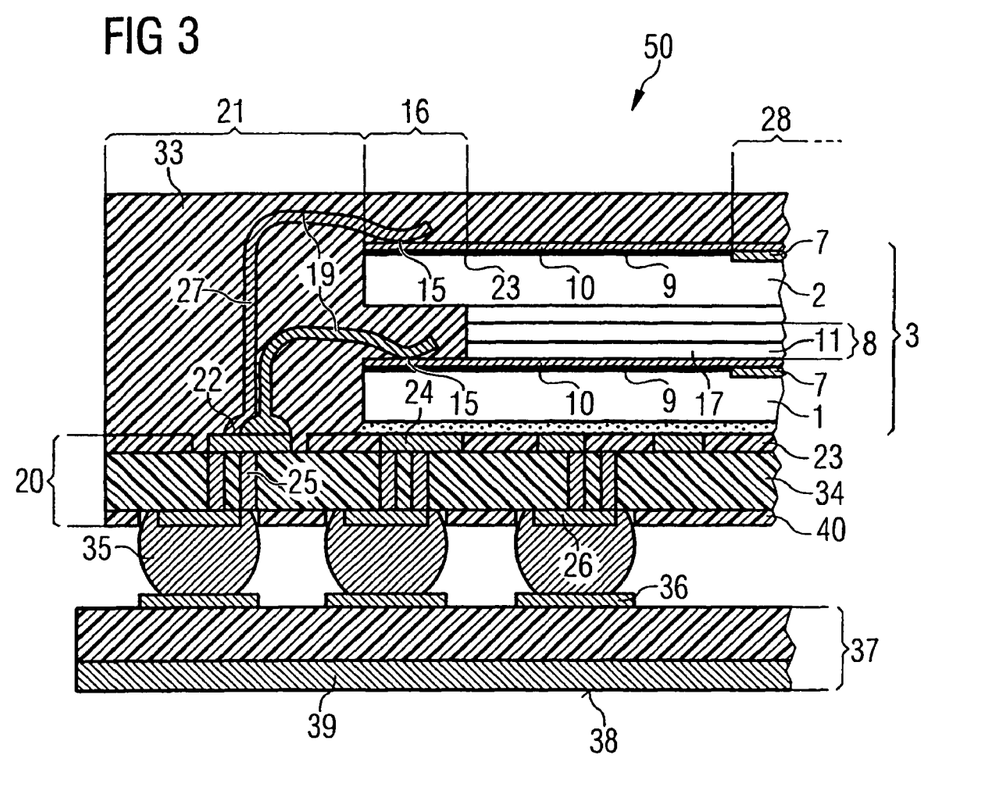
FIG. 3 schematically depicts a cross-section through a semiconductor device of a second embodiment of the present invention.

FIG. 3 shows a schematic cross-section through a semiconductor device 50 of a second embodiment of the invention. Components with the same functions as in FIG. 1 or in FIG. 2 are identified by the same designations and are thus not further described.

The semiconductor device 50 depicted in FIG. 3 includes a chip stack 3 with a first semiconductor chip 1 and a stacked second semiconductor chip 2. These semiconductor chips 1 and 2 are memory chips with a central region 28, which includes both signal contact areas and ground or supply contact areas 7. In the case of this cross-section, a section was only taken through ground or supply contact areas 7, while the signal contact areas are arranged in front of and behind the image plane.

The semiconductor chips 1 and 2 include active upper sides 4 and 5, respectively, on which a rewiring level 8 is in each case arranged. This rewiring level 8 includes at least two layers, an insulating layer 9 and a rewiring layer 10 comprising a patterned metal layer. Arranged in the peripheral regions 16 of the rewiring layers 10 of the semiconductor chips 1 and 2 shown are connection contact areas and, in this embodiment, ground or supply connection contact areas 15. Arranged between the ground or supply connection contact areas 15 and the ground or supply contact areas 7 in a central region 28 on the semiconductor chips 1 and 2 are ground or supply conductor paths, which are arranged parallel to the signal conductor paths, which cannot be seen, in front of and behind the plane of the drawing. This means that between the signal conductor paths there is in each case a ground or supply conductor path 13, which minimizes the impedance or inductance of the leads in the region of the rewiring level 8.

The rewiring level 8 of the first semiconductor chip 1 includes a covering level 11, which comprises an insulating material, and also acts as an adhesive layer and leaves the ground or supply connection contact areas 15 free in the peripheral region 16, with a covering insulating layer 17, this is formed in the case of the upper rewiring level 8 by the plastic package molding compound 33, which completely embeds the chip stack 3 including the semiconductor chips 1 and 2 with their rewiring levels 8.

The chip stack 3 is arranged on a multilayered substrate 20, which includes a substrate rewiring layer 23 with rewiring lines 24. In a peripheral region 21 of the substrate 20 that is not covered by the semiconductor chip stack 3, substrate connection areas 22 are provided. In the cross-section shown, bonding connections 27 for a ground or supply conductor path 13 of the lower first semiconductor chip 1 and for a ground or supply conductor path 13 of the upper second semiconductor chip 2 lead to the substrate connection areas 22. Consequently, the bonding connections 27 connect the individual stacked semiconductor chips 1 and 2 to corresponding substrate connection areas 22.

An insulating core layer 34 of the substrate 20 includes contact vias 25 at the locations at which external contact areas 26 for external contacts 35 of the semiconductor device 30 are provided. A solder resist layer 40 ensures that the solder material of the external contacts 35 remains restricted to the external contact areas 26, in that it covers the entire underside of the semiconductor device 30 apart from the external contact areas 26.

In FIG. 3 it is additionally shown that the external contacts 35 are arranged on corresponding contact areas 36 of a leadground 37 of a higher-level circuit. The leadground 37 is plated on its underside 38 or in an inner level with a metal layer 39, which for its part is connected to ground or supply potential. The additional ground or supply conductor tracks 13 in each of the rewiring levels 8 of the stacked semiconductor chips 1 and 2 have the effect that the induction cross-section between conductor paths carrying ground or supply potential and signal-carrying conductor paths is reduced considerably in comparison with an induction cross-section between signal conductor paths and the metal layer 39 of the leadground 37, and consequently the impedance values of the signal leads to the signal contact areas on the semiconductor chips in the corresponding central regions 28 is reduced.

Figure 4:
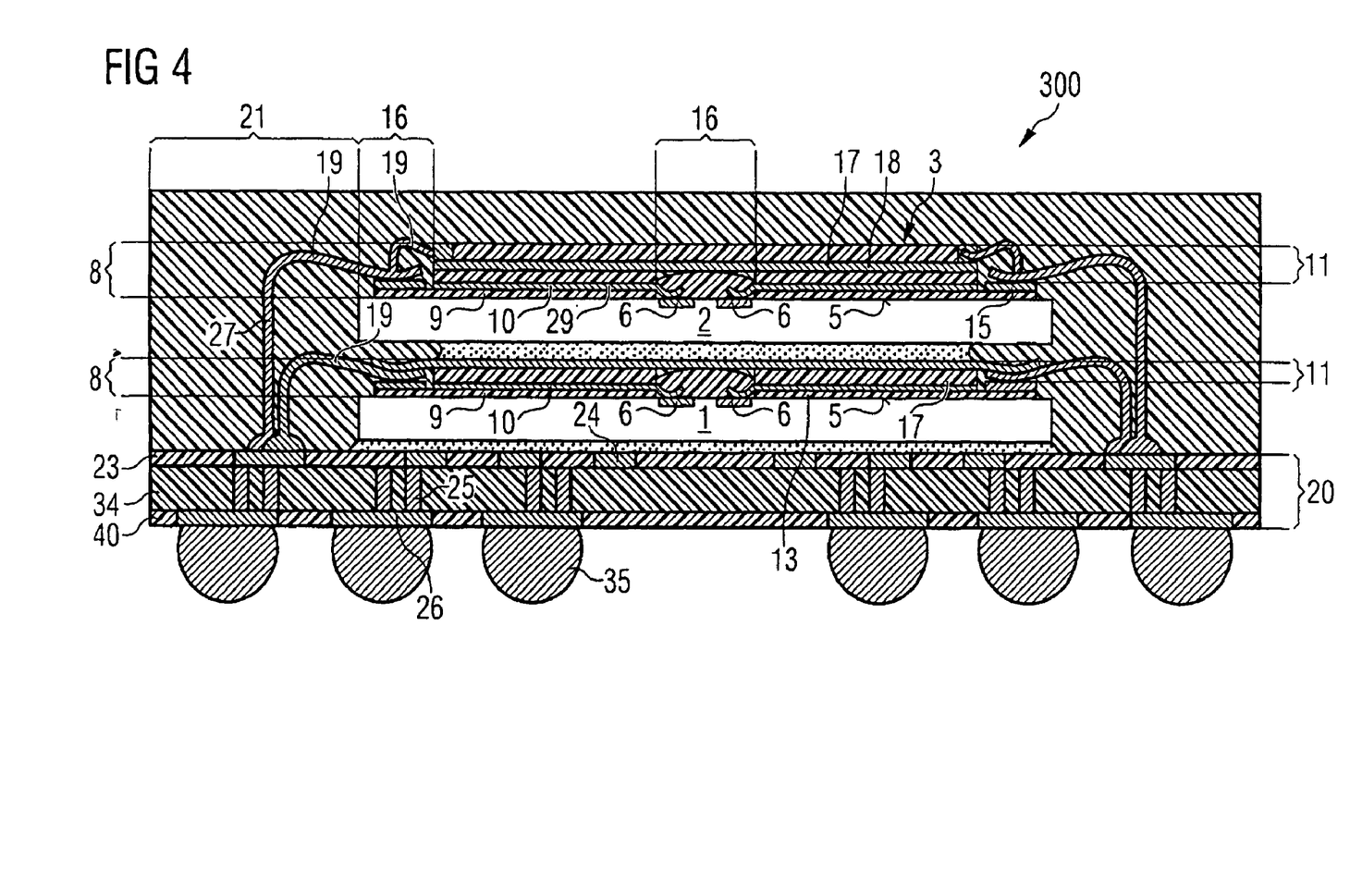
FIG. 4 schematically depicts a cross-section through a semiconductor device of a third embodiment of the present invention.

FIG. 4 shows a schematic cross-section through a semiconductor device 300 of a third embodiment of the invention. Components with the same functions as in FIG. 2 are identified by the same designations and are thus not further described.

The difference between the third embodiment of the invention according to FIG. 4 and the second embodiment of the invention according to FIG. 3 is that the covering level 11, which also acts as an adhesive layer, of the rewiring layers 8 on the respective semiconductor chips 1 and 2 has a non-patterned closed metallic covering, which for its part can be connected by a ground or supply connection and the bonding wires 27 to the ground or supply potential of an external contact 35.

In this third embodiment of the invention, it is adequate that a closed electrically conducting layer 18 of metal is provided in the covering level 11 of the semiconductor chips 1 and 2, while the rewiring layer 10 of the rewiring level 8 has parallel-routed predominantly signal conductor paths 6. While the induction area with such an electrically conducting layer 18 between the ground or supply potential of this layer and the signal potentials of the signal conductor paths is further reduced, the capacitive coupling increases slightly. In total, however, the overall impedance is reduced to the values specified above, so that the third embodiment of the invention is suitable for satisfying the "high performance" criteria of DDR-II memory chips or still higher quality requirements.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor device comprising:
   a plastic package;
   a semiconductor chip comprising an active upper side with signal contact areas that are arranged in rows and in a central bonding channel; and
   a rewiring level arranged on the active upper side of the semiconductor chip and comprising an insulating layer, a rewiring layer arranged on the insulating layer and a closed metal layer that includes a bonding channel opening in the region of the central bonding channel;
   wherein:
      the semiconductor chip is fixed on the closed metal layer of the rewiring level by an adhesive bond and an insulating layer in such a way that the signal contact areas of the semiconductor chip are arranged in the bonding channel opening;
      the insulating layer of the rewiring level includes contact vias that extend from the closed metal layer to external contact areas for ground connections, and
      the rewiring layer comprises (i) signal conductor paths that extend from the central bonding channel to external contact areas for signal connections and (ii) ground or supply conductor paths that also extend from the central bonding channel, wherein the ground or supply conductor paths are arranged parallel to one another and in an alternating stacked relationship with the signal conductor paths, and the ground or supply conductor paths have a smaller width than the signal conductor paths.

2. The semiconductor device of claim 1, wherein the signal contact areas of the semiconductor chip are electrically connected to the signal conductor paths by bonding wires in the bonding channel.

3. The semiconductor device of claim 1, wherein the plastic package comprises a plastic molding compound that covers the closed metal layer of the rewiring level and the semiconductor chip on a back side and on peripheral sides of the semiconductor chip.

4. The semiconductor device of claim 3, wherein the plastic molding compound further covers the bonding channel opening in the rewiring level.

5. A method for producing a semiconductor device with a metal layer and a rewiring layer of a rewiring level, the method comprising:
   providing a metal foil for the metal layer, the metal foil including device positions and bonding channel openings provided in the device positions;
   applying an insulating layer to the metal foil;
   introducing contact vias for ground or supply connections into the insulating layer;
   applying a patterned rewiring layer to the insulating layer, the patterned rewiring layer including rewiring lines and external contact areas, the rewiring lines extending from a region of a bonding channel opening to the external contact areas, the rewiring lines including signal conductor paths and ground or supply conductor paths, wherein the ground or supply conductor paths are arranged parallel to one another and in an alternating stacked relationship with the signal conductor paths, and the ground or supply conductor paths have a smaller width than the signal conductor paths;
   introducing a central bonding channel opening into device positions of the rewiring level;
   applying an adhesive with bonding channel openings to the metal foil;
   applying semiconductor chips to the adhesive film, while aligning central bonding channels of the semiconductor chips with the bonding channel opening in the rewiring level;
   establishing bonding connections between the signal contact areas and the rewiring lines;
   coating the rewiring level with a plastic package molding compound and embedding the semiconductor chips in the plastic package molding compound while forming a composite sheet;
   covering the bonding channels with plastic package molding compound; and
   dividing the composite sheets up into individual semiconductor devices.

6. A chip stack of semiconductor chips, comprising:
   a first semiconductor chip and at least one stacked second semiconductor chip, the semiconductor chips comprising active upper sides with signal contact areas and ground or supply contact areas; and
   a rewiring level disposed at least on the active upper side of the second semiconductor chip, the rewiring layer including an insulating layer on the active upper side of the second semiconductor chip, and a rewiring layer on the insulating layer;
   wherein the rewiring layer comprises:
      signal conductor paths arranged parallel to one another, the signal conductor paths extending from the signal contact areas to signal connection contact areas in a peripheral region of the rewiring layer,
      ground or supply conductor paths extending from ground or supply contact areas to ground or supply connection contact areas in the peripheral region of the rewiring layer, the ground or supply conductor paths being arranged parallel to one another and in an alternating stacked relationship with the signal conductor paths on the rewiring layer, and
   wherein the ground or supply conductor paths have a smaller width than the signal conductor paths.

7. The chip stack of claim 6, further comprising:
a multilayered covering level including at least one covering insulating layer on the rewiring layer and at least one electrically conducting layer on the covering insulating layer.

8. The semiconductor device of claim 6, wherein the stacked semiconductor chips are arranged on a multilayered substrate, and the substrate comprises:
a peripheral region including substrate connection areas that are not covered by the chip stack and are electrically connected to the signal connection contact areas or the ground or supply connection contact areas; and
at least one substrate rewiring layer including rewiring lines that extend via contact wires in the substrate from the substrate connection areas to external contact areas of the semiconductor device.

9. A method for producing a semiconductor device, comprising:
providing a plurality of semiconductor chips to be stacked, each of the semiconductor chips comprising an active upper side, a signal contact area and at least one ground or supply contact area;
applying an insulating layer to at least the active upper side of one semiconductor chip;
applying and patterning a rewiring layer to the insulating layer, the rewiring layer comprising (i) signal conductor paths that extend parallel to one another and from the signal contact areas to signal connection contact areas in a peripheral region of the rewiring layer and (ii) ground or supply conductor paths that are arranged parallel to one another and in an alternating stacked relationship with the signal conductor paths, the ground or supply conductor paths extending from ground or supply contact areas to at least one ground or supply connection contact area, and wherein the ground or supply conductor paths have a smaller width than the signal conductor paths;
applying a covering level to the rewiring layer; and
stacking the semiconductor chips with at least one rewiring level on a multilayered substrate, while producing bonding connections during stacking between the signal connection contact areas or at least one ground or supply connection contact area at the rewiring layer and corresponding substrate connection areas.

10. The method of claim 9, wherein the covering level comprises an insulating material.

11. The method of claim 9, wherein the application of the covering level includes applying a covering insulating layer to the rewiring layer and applying an electrically conducting layer to the covering insulating layer, and the method further comprises:
during stacking of the semiconductor chips, producing further bonding connections between the electrically conducting layer and the at least one ground or supply connection contact area.

12. A rewiring level for a semiconductor device, comprising:
a closed metal layer having an opening for a central bonding channel;
an insulating layer disposed on the closed metal layer and having an opening for the central bonding channel; and
a rewiring layer comprising (i) signal conductor paths that extend from signal contact areas in the central binding channel to signal connection contact areas in a peripheral region of the rewiring layer and (ii) ground or supply conductor paths that are arranged parallel to one another and in an alternating stacked relationship with the signal conductor paths, the ground or supply conductor paths extending from ground or supply contact areas to at least one ground or supply connection contact, wherein the central bonding channel is arranged in a direction that is substantially perpendicular to the signal conductor paths and the ground or supply conductor paths, and wherein the ground or supply conductor paths have a smaller width than the signal conductor paths.

* * * * *